(12) United States Patent
Kawai et al.

(10) Patent No.: US 7,557,392 B2
(45) Date of Patent: Jul. 7, 2009

(54) FIELD EFFECT TRANSISTOR AND MAKING METHOD

(75) Inventors: Tomoji Kawai, Minoh (JP); Masateru Taniguchi, Toyonaka (JP); Ikuo Fukui, Joetsu (JP)

(73) Assignees: Osaka University, Suita-shi (JP); Shin-Etsu Chemical Co., Ltd., Tokyo (JP)

( * ) Notice: Subject to any disclaimer, the term of this patent is extended or adjusted under 35 U.S.C. 154(b) by 311 days.

(21) Appl. No.: 11/199,152

(22) Filed: Aug. 9, 2005

(65) Prior Publication Data
US 2006/0043432 A1    Mar. 2, 2006

(30) Foreign Application Priority Data
Aug. 31, 2004  (JP) .............................. 2004-251779

(51) Int. Cl.
*H01L 35/24* (2006.01)
*H01L 51/00* (2006.01)
(52) U.S. Cl. .......................................... 257/253; 257/40
(58) Field of Classification Search ................... 257/40, 257/253
See application file for complete search history.

(56) References Cited

U.S. PATENT DOCUMENTS

| | | | |
|---|---|---|---|
| 4,322,524 A | 3/1982 | Onda et al. | |
| 5,347,144 A | 9/1994 | Garnier et al. | |
| 5,705,826 A | 1/1998 | Aratani et al. | |
| 5,892,244 A * | 4/1999 | Tanaka et al. | 257/40 |
| 6,344,660 B1* | 2/2002 | Dimitrakopoulos et al. | 257/40 |
| 7,029,945 B2* | 4/2006 | Veres et al. | 438/99 |
| 7,098,525 B2* | 8/2006 | Bai et al. | 257/642 |
| 7,256,436 B2* | 8/2007 | Fukui | 257/292 |
| 7,315,042 B2* | 1/2008 | Gerlach et al. | 257/40 |
| 2001/0006749 A1* | 7/2001 | Shackle | 429/212 |
| 2002/0158295 A1 | 10/2002 | Armgarth et al. | |
| 2005/0045876 A1* | 3/2005 | Fukui | 257/40 |
| 2005/0279995 A1* | 12/2005 | Shin et al. | 257/40 |
| 2006/0131561 A1* | 6/2006 | Hirai et al. | 257/40 |

FOREIGN PATENT DOCUMENTS

| | | |
|---|---|---|
| EP | 1361619 A2 | 11/2003 |
| JP | 59-31521 B2 | 8/1984 |
| JP | 5-508745 A | 12/1993 |
| WO | WO-03/052835 A1 | 6/2003 |

(Continued)

OTHER PUBLICATIONS

Nilsson, David et al., "An all-organic sensor-transistor based on a novel electrochemical transducer concept printed electrochemical sensors on paper", Sensors and Actuators B, vol. 86, pp. 193-197, 2002.

(Continued)

*Primary Examiner*—Jerome Jackson, Jr.
*Assistant Examiner*—Anthony Ho
(74) *Attorney, Agent, or Firm*—Birch, Stewart, Kolasch & Birch, LLP

(57) ABSTRACT

In a thin-layer chemical transistor having a metal/solid electrolyte/semiconductor structure, the materials of which the solid electrolyte and semiconductor layers are made comprise organic solvent-soluble compounds. The transistor can be fabricated solely by solvent processes, typically printing techniques including ink jet printing.

14 Claims, 2 Drawing Sheets

FOREIGN PATENT DOCUMENTS

WO  WO-2004/075279 A1  2/2004

OTHER PUBLICATIONS

Hetrick, Robert E. et al., "An electrochemical transistor using a solid electrolyte", Applied Physics Letters, vol. 37, No. 5, pp. 494-496, Sep. 1, 1980.

Taniguchi, Masateru et al., "Vertical electrochemical transistor based on poly(3-hexylthiophene) and cyanoethylputlulan", Applied Physics Letters, vol. 85, No. 15, pp. 3298-3300, Oct. 11, 2004.

* cited by examiner

OFF

ON

○ Li$^+$

● BF$_4^-$

FIELD EFFECT TRANSISTOR AND MAKING METHOD

CROSS-REFERENCE TO RELATED APPLICATION

This non-provisional application claims priority under 35 U.S.C. §119(a) on Patent Application No. 2004-251779 filed in Japan on Aug. 31, 2004, the entire contents of which are hereby incorporated by reference.

TECHNICAL FIELD

This invention relates to a Shottky barrier gate field-effect transistor (SB-FET or MES-FET) which is one class of field-effect transistors (FET), and more particularly, to a thin-layer chemical transistor comprising a metal layer, a semiconductor layer containing a specific organic substance, and a solid electrolyte layer containing a specific polymer having a high ionic conductivity between the metal and semiconductor layers; and a method for preparing the same.

BACKGROUND ART

Thin-layer field-effect transistors (TFTs) utilizing silicon semiconductor or compound semiconductor are used in general integrated circuits and other expanding applications. In particular, the use of TFTs in liquid crystal displays is well known. The recent trend taken for liquid crystal displays is to increase the display size and the image definition. It has become more desirable than ever to incorporate a multiplicity of TFTs corresponding to the number of pixels.

However, when circuits are formed on substrates, conventional metal-base semiconductors used in the art cannot avoid introduction of small defects in TFTs formed due to photoresist processing steps including patterning and etching and hence, display defects in corresponding pixels. These processing steps impose a certain limit to the desire to reduce the TFT manufacturing cost. The same is true to other flat displays like plasma displays and organic EL displays if TFTs are used therein.

The recent trend toward larger display area and finer image definition leads to a propensity to increase the probability of defects in TFT manufacture. It is strongly desired to minimize TFT defects.

For TFTs having a metal/insulator/semiconductor (MIS) structure, attempts were made to form the insulator and semiconductor from organic materials. For example, JP-A 5-508745 (U.S. Pat. No. 5,347,144) describes that a device fabricated using an insulating organic polymer having a dielectric constant of at least 5 as the insulating layer, and a polyconjugated organic compound having a weight average molecular weight of up to 2,000 as the semiconductor layer exhibits a field effect and has a mobility of approximately $10^{-2}$ cm$^2$V$^{-1}$ s$^{-1}$. Since the semiconductor layer is formed by using alpha-sexithienyl as the organic semiconductor material and effecting evaporation, processing steps including patterning and etching through a photoresist or the like are necessary, inhibiting cost reductions.

While TFTs having the MIS structure and TFTs having the metal/semiconductor (MES) structure primarily using compound semiconductor are known, few use a solid electrolyte as the interlayer material between metal and semiconductor.

SUMMARY OF THE INVENTION

An object of the present invention is to provide a novel thin-layer chemical transistor in which defects are minimized simply by using organic solvent-soluble compounds to form the solid electrolyte and semiconductor layers; and a method for preparing the same.

The inventor has found that in a thin-layer chemical transistor having a metal/solid electrolyte/semiconductor structure, defects can be minimized simply by using organic solvent-soluble compounds to form the solid electrolyte and semiconductor layers.

Among organic semiconductor materials, some of the materials capable of reversible electrochemical oxidation and reduction show a dramatic increase of their electrical conductivity as compared with that in the neutral state. When a polymer having a high ionic conductivity plus an inorganic ion salt is used as the interlayer material between a metal and the organic semiconductor having the above-mentioned characteristics, the absence of a depletion layer or an inversion layer as found in conventional FETs, the high ionic conductivity of the polymer electrolyte, and the reversible doping ability of organic semiconductor cooperate to exert transistor performance.

In one aspect, the invention provides a thin-layer chemical transistor having a metal/solid electrolyte/semiconductor structure, wherein the materials of which the solid electrolyte and semiconductor layers are made comprise organic solvent-soluble compounds.

In some preferred embodiments, the solid electrolyte layer comprises an organic solvent-soluble compound and an inorganic ion salt; the organic solvent-soluble compound of which the solid electrolyte layer is made has an ionic conductivity of at least $1 \times 10^{-5}$ Scm$^{-1}$; the organic solvent-soluble compound of which the solid electrolyte layer is made is a polymer having a weight average molecular weight of 2,000 to 1,000,000 as measured by GPC relative to polystyrene standards; the organic solvent-soluble compound of which the solid electrolyte layer is made is an insulating polymer having cyano groups; the organic solvent-soluble compound of which the solid electrolyte layer is made is an insulating polymer having cyanoethyl groups; the organic solvent-soluble compound of which the solid electrolyte layer is made is cyanoethylpullulan; and the insulating polymer having cyanoethyl groups contains up to 100 ppm of bis-2-cyanoethyl ether.

In some other preferred embodiments, the organic solvent-soluble compound of which the semiconductor layer is made is electrochemically reversible; the organic solvent-soluble compound of which the semiconductor layer is made is copper phthalocyanine; the organic solvent-soluble compound of which the semiconductor layer is made is a polymer having a weight average molecular weight of 2,500 to 1,000,000 as measured by GPC relative to polystyrene standards; and the organic solvent-soluble compound of which the semiconductor layer is made is a polythiophene.

In another aspect, the invention provides a method for preparing a thin-layer chemical transistor, comprising the steps of applying a solution of an organic solvent-soluble compound and an inorganic ion salt in an organic solvent onto a gate electrode in the form of a metal layer, drying the applied solution to form a solid electrolyte layer on the gate electrode, applying onto the solid electrolyte layer a solution of a semiconductor layer-forming material in another organic solvent which does not dissolve the solid electrolyte layer, and drying the applied solution to form a semiconductor layer on the solid electrolyte layer.

The present invention offers a novel transistor having a metal/solid electrolyte/semiconductor structure. Since both the solid electrolyte layer material and the semiconductor layer material are soluble in organic solvents, the transistor is fabricated solely by solvent processes, as opposed to conventional field-effect transistors of the metal/insulator/semiconductor structure that require such processing as patterning and etching through photoresist or the like in the circuit-forming technology using metal-based semiconductor and insulator. That is, the transistor of the invention can be readily fabricated by printing techniques including ink jet printing. This enables to reduce the probability of TFT defects as well as the cost of fabrication.

A switching speed of at least 50 Hz permits the transistors to be applied to the drive circuit in paper displays and flat panel displays.

DETAILED DESCRIPTION OF PREFERRED EMBODIMENTS

Figure 1:
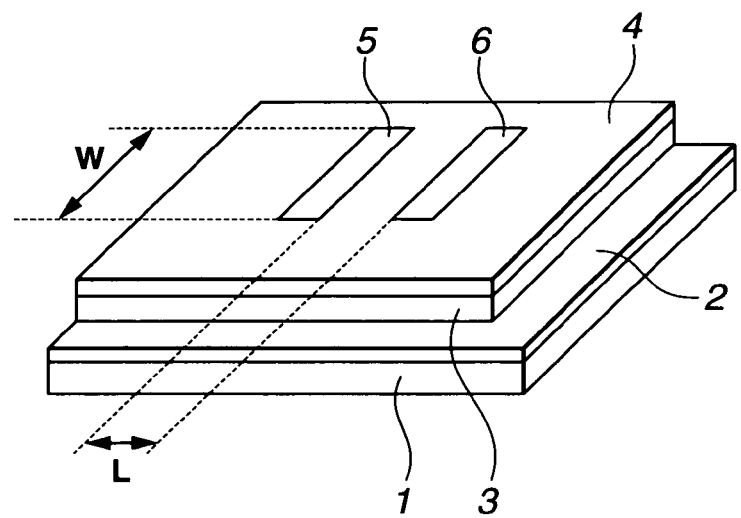
FIG. 1 is a perspective view of a thin-layer chemical transistor in one embodiment of the invention.

Referring to FIG. 1, there is illustrated in a perspective view a thin-layer chemical transistor in one embodiment of the invention. The thin-layer chemical transistor of the invention has the same structure as conventional field-effect transistors except that a solid electrolyte film comprising an organic solvent-soluble compound is used instead of the gate insulator.

Specifically, the transistor is illustrated as comprising a substrate 1 of $SiO_2$ or the like, a metal layer 2 formed on the substrate 1 and serving as a gate electrode, an inorganic ion salt-containing solid electrolyte layer 3 formed on the metal layer 2, and a semiconductor layer 4 formed on the layer 3. Source and drain electrodes 5 and 6 are formed on the semiconductor layer 4.

The metal layer used herein may be a conventional indium tin oxide (ITO) film, or a single metal layer such as Au, Cu or Al or a metal layer laminate such as Au/Ti, Cu/Ti or Al/Ti which is formed by physical vapor deposition (PVD) or metal organic chemical vapor deposition (MOCVD). Since a possibility of film formation by printing is advantageous to the objects of the invention, the use of conductive metal paste is preferred as long as it raises no practical problems.

In the thin-layer chemical transistor of the invention, the solid electrolyte layer comprises an organic solvent-soluble compound and an inorganic ion salt. The organic solvent-soluble compound is preferably a high molecular weight compound or polymer having a weight average molecular weight (Mw) of 2,000 to 1,000,000 as measured by gel permeation chromatography (GPC) relative to polystyrene standards, and more preferably an insulating polymer having cyano groups. Examples include cyanoethylpullulan, cyanoethylcellulose, cyanoethylpolyvinyl alcohol, and polyacrylonitrile, with cyanoethylpullulan being most preferred. The insulating polymer having cyano groups, in which many polarization groups are present within the molecule (for example, cyanoethylpullulan is a highly dielectric material having a dielectric constant of 19 at 1 kHz), functions to relax the electrostatic energy of the inorganic ion salt which is the other component of the solid electrolyte layer, and promote its dissociation into ions so that anion and cation species become movable ions, forming a solid electrolyte exhibiting ionic conductivity.

The insulating polymer having cyano groups, for example, cyanoethylpullulan is obtained by reacting a pullulan resin with acrylonitrile in the presence of an alkali catalyst (see JP-B 59-31521). Side reaction associated with this reaction forms bis-2-cyanoethyl ether, which must be removed by a purifying step. The reason is that although an insulating polymer having cyano groups is a substance which exhibits dielectric characteristics when polar groups within its molecule are oriented in an electric field, the presence of the reaction by-product, bis-2-cyanoethyl ether in a noticeable amount leads to an undesired increase of dielectric loss which is a loss factor. Therefore, the content of bis-2-cyanoethyl ether remaining in the insulating polymer having cyano groups should preferably be controlled to 100 ppm or less, and more preferably 50 ppm or less.

The thin-layer chemical transistor of the invention utilizes reversible doping of an organic semiconductor by ion transport. Thus the insulating polymer should preferably have a higher ionic conductivity of typically at least $1 \times 10^{-5}$ Scm$^{-1}$ and more preferably at least $1 \times 10^{-4}$ Scm$^{-1}$. The upper limit is not critical.

The insulating polymer having cyano groups preferably has a percent substitution with cyano groups (e.g., a percent substitution with cyanoethyl groups in the case of cyanoethylpullulan) of at least 80 mol %, and more preferably 85 to 100 mol %. This is because dissociation of an ion species is promoted by cyano groups or polarization groups as mentioned above and a polar group (cyano group) concentration equal to or above a certain level is necessary for such promotion, and also because a substantial amount of residual hydroxyl groups can lead to a larger dielectric loss, considered a loss factor, which may be detrimental to the objects of the invention.

The other component of the solid electrolyte layer is the inorganic ion salt which contains at least one element selected from among Li, Na, K, Cs, Ag, Cu, Mg and Rb. The anion is not particularly limited as long as it forms an inorganic ion salt which is soluble in an organic solvent. Suitable anions include $Ce^-$, $I^-$, $Br^-$, $ClO_4^-$, $SCN^-$, $BF_4^-$, $AsF_5^-$, $CF_3SO_3^-$, $PF_4^-$, $PF_5^-$, $PF_6^-$, and $NO_3^-$.

Illustrative examples of the inorganic ion salt include $LiClO_4$, $LiI$, $LiSCN$, $LiBF_4$, $LiAsF_5$, $LiCF_3SO_3$, $LiPF_4$, $NaI$, $NaSCN$, $NaBr$, $NaPF_5$, $KI$, $KSCN$, $KPF_5$, $KAsF_5$, $CsSCN$, $CsPF_6$, $AgNO_3$, $CuCl_2Mg(ClO_4)_2$, and $Rb_4I_{1.75}Cl_{3.25}$. These salts may be used alone or in admixture of two or more.

An appropriate amount of the inorganic ion salt is 0.01 to 80% by weight, more preferably 0.5 to 20% by weight based on the weight of the polymer.

In the inventive thin-layer chemical transistor, the semiconductor layer is not critical as long as it is capable of reversible electrochemical oxidation and reduction, in other words, taking alternate p- and n-type structures in a reversible manner. The semiconductor layer can operate in principle independent of a molecular weight. Therefore, the material of which the semiconductor layer is formed is not critical as long as it is capable of reversible electrochemical oxidation and reduction and has a higher electrical conductivity than in the neutral state. The semiconductor material should be dissolvable in an organic solvent in which the solid electrolyte layer is not dissolvable. This is because the semiconductor/electrolyte interface otherwise becomes non-uniform when semiconductor and solid electrolyte layers are formed by overcoating or lamination.

The prior art studies on organic TFTs resulted in a method of forming an organic semiconductor layer on an organic insulator film by evaporation as described in JP-A 5-508745 and a method of forming only an organic semiconductor layer on an inorganic insulator film. In an example wherein both an organic semiconductor material and an organic insulating material are used as solutions in a common organic solvent, the organic insulating material solution is first coated and dried to form an organic insulating layer, on which the organic semiconductor material solution is coated. At the coating interface, part of the organic insulating material is dissolved again. This introduces disorders at the interface of the laminate after final drying. The present invention is successful in avoiding this problem. In the invention, the semiconductor material and the solid electrolyte material are dissolvable in organic solvents of different type. That is, either one of the materials is not dissolvable in either one of the solvents. Specifically, suitable organic solvent-soluble compounds for forming the semiconductor layer include low molecular weight compounds such as pentacene, copper phthalocyanine, and α-sexithienyl; and high molecular weight compounds such as polythiophenes, polypyrroles, polyanilines, polyacetylenes, poly(thienylene vinylene)s, and poly(phenylene vinylene)s. In the case of low molecular weight compounds, however, some are difficult to form a film by a so-called printing technique. In this regard, the semiconductor layer in the present invention prefers an organic solvent-soluble polymer having a weight average molecular weight (Mw) of 2,000 to 1,000,000 as measured by GPC relative to polystyrene standards. Examples of the preferred polymer include polythiophenes, polypyrroles, polyanilines, polyacetylenes, poly(thienylene vinylene)s, and poly(phenylene vinylene)s. In consideration of factors including solubility in organic solvents, easy processing, stability, reversible electrochemical oxidation/reduction, and a dramatically increased electrical conductivity over that in the neutral state, polythiophenes, typically poly(3-hexylthiophene) are most preferred. Polythiophenes are known as polymers that provide p-type organic field-effect transistors and exhibit a high field-effect mobility. It is also known that polythiophenes undergo reversible electrochemical oxidation and reduction in an organic solvent. A doped polythiophene prepared by the electrolytic method is known to have an electrical conductivity which is higher by a factor of at least 1,000 than neutral polythiophene.

Examples of the organic solvent in which the compound for forming the solid electrolyte layer is dissolvable include N-methyl-2-pyrrolidone, dimethylformamide, acetone, acetonitrile, and γ-butyrolactone. Examples of the other organic solvent in which the compound for forming the semiconductor layer is dissolvable include chloroform, toluene, hexane and alcohols. In either case, one or more solvents may be used.

In the practice of the invention, a solution of an organic solvent-soluble compound and an inorganic ion salt in an organic solvent is coated and dried onto a gate electrode in the form of a metal layer to form a solid electrolyte layer. Thereafter, a semiconductor layer-forming material which is soluble in another organic solvent in which the solid electrolyte layer is not soluble is dissolved in the other organic solvent to form a solution, which is coated and dried onto the solid electrolyte layer to form a semiconductor layer for the fabrication of a thin-layer chemical transistor. In the latter stage, any well-known methods may be employed. Specifically, a substrate is selected from glass or conventional polymer sheets. A metal layer serving as the gate electrode is formed on the substrate by sputtering or by applying a metal paste or conductive polymer through spin coating, screen printing or ink jet printing, and drying. Alternatively, commercially available ITO-coated glass may be used.

On the gate electrode thus formed, a solution of a solid electrolyte layer-forming compound and an inorganic ion salt in an organic solvent is coated by spin coating, screen printing or ink jet printing, and dried, thus forming a solid electrolyte layer.

Thereafter, a solution of a semiconductor layer-forming material in another organic solvent which does not dissolve the solid electrolyte layer-forming compound is coated onto the solid electrolyte layer by spin coating, screen printing or ink jet printing, and dried to form a semiconductor layer. Before this stage, the surface of the solid electrolyte layer may be subjected to well-known rubbing or physical treatment in order that semiconductor molecules be oriented at the solid electrolyte layer/semiconductor layer interface.

Finally, source and drain electrodes are formed on the semiconductor layer by sputtering or by applying a metal paste or conductive polymer through screen printing or ink jet printing, and drying.

Though not critical, it is preferred that the solid electrolyte layer have a thickness of 0.2 to 10 μm, especially 0.5 to 3 μm and the semiconductor layer have a thickness of 50 to 300 nm, especially 100 to 200 nm.

The thin-layer chemical transistor of the invention has the structure comprising in sequence, a gate electrode in the form of a metal layer, a solid electrolyte layer containing an inorganic ion salt, and a semiconductor layer. Source and drain electrodes are formed on the semiconductor layer. The transistor relies on the mechanism that a potential applied to the gate induces dissociation of the inorganic ion salt, whereby the semiconductor material in proximity to the solid electrolyte layer is doped therewith to form a path having a high electrical conductivity. There is absent a depletion layer or an inversion layer as found in conventional FETs. Additionally, the transistor utilizes the two natures, the high ionic conductivity of the solid electrolyte and the reversible doping ability of the semiconductor layer-forming compound, typically polythiophene.

Figure 2A:
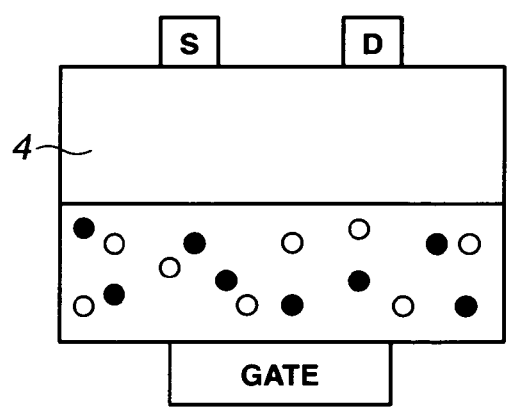
FIG. 2 diagrammatically illustrates electrochemical reaction in proximity to the interface between an electrolyte layer and a semiconductor layer, FIG. 2A showing the OFF state with no voltage applied and FIG. 2B showing the ON state (doped state) with a certain voltage applied.
Figure 2B:
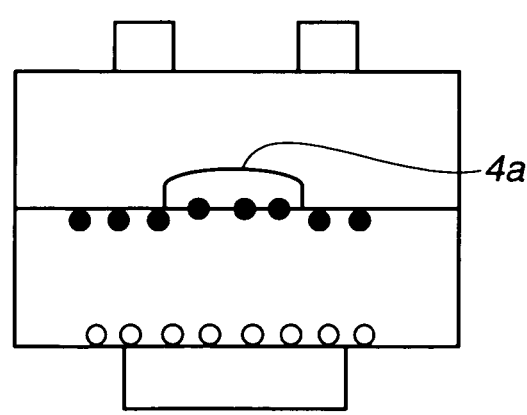

The thin-layer chemical transistor of the invention operates on the principle that when a potential is applied to the gate, as shown in FIG. 2, electrochemical reaction takes place near the interface between solid electrolyte and semiconductor layers according to the oxidation/reduction scheme shown below. Note that 4a is a doped region of the semiconductor layer 4.

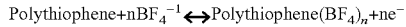

$$\text{Polythiophene} + n\text{BF}_4^{-1} \longleftrightarrow \text{Polythiophene}(\text{BF}_4)_n + ne^-$$

This electrochemical reaction is controlled by reversible semiconductor (metal)-solid electrolyte transition by way of doping and dedoping, thereby modulating the current flow between source and drain electrodes. The neutral polythiophene corresponds to the OFF state and the doped polythiophene corresponds to the ON state. Therefore, the interface state between the solid electrolyte and semiconductor layers is very important. The flatter the interface, the better becomes the device operation.

EXAMPLE

Examples of the invention are given below by way of illustration and not by way of limitation.

Example 1

The polymer for forming the solid electrolyte layer was cyanoethylpullulan having a degree of substitution with cyanotheyl groups of 85.2 mol % (CyEPL, by Shin-Etsu Chemical Co., Ltd., CR-S, Mw: 49,000, bis-2-cyanoethyl ether content: 46 ppm). The inorganic ion salt used was $LiBF_4$. The material for forming the semiconductor layer was poly(3-hexylthiophene) (P3HT, Aldrich, Mw: 87,000). The organic solvent for dissolving poly(3-hexylthiophene) (P3HT) was chloroform in which the cyanoethylpullulan was not dissolvable. Using these materials, a thin-layer chemical transistor was fabricated by the following procedure. It was then tested.

A gate electrode was formed on a glass ($SiO_2$) substrate by vapor depositing Ti to a thickness of 5 nm and then Au to a thickness of 20 nm, both by RF sputtering at room temperature and a back pressure of $10^{-4}$ Pa.

Cyanoethylpullulan was dissolved in N-methyl-2-pyrrolidone in a concentration of 15 wt %. To the solution, $LiBF_4$ was added in a concentration of 5 wt % relative to the pullulan. The pullulan was dissolved into a solution, which was passed through a 0.2-μm membrane filter, spin coated, and dried at 100° C. for one hour, forming an solid electrolyte layer on the gate electrode.

A 0.8 wt % solution of poly(3-hexylthiophene) in chloroform was passed through a 0.2-μm membrane filter, spin coated, and dried at 100° C. for one hour, forming a semiconductor layer of 50 nm thick on the solid electrolyte layer. Finally, source and drain electrodes were formed by thermal evaporation.

The solid electrolyte layer had a thickness of 700 nm, the poly(3-hexylthiophene) layer had a thickness of 100 nm, and the source and drain electrodes had a width W of 2 mm and were spaced a distance L of 30 μm (see FIG. 1). Electrical measurements were performed under conditions: room temperature, light-shielded, and a vacuum of $1.3 \times 10^{-3}$ Pa or below.

Figure 3:
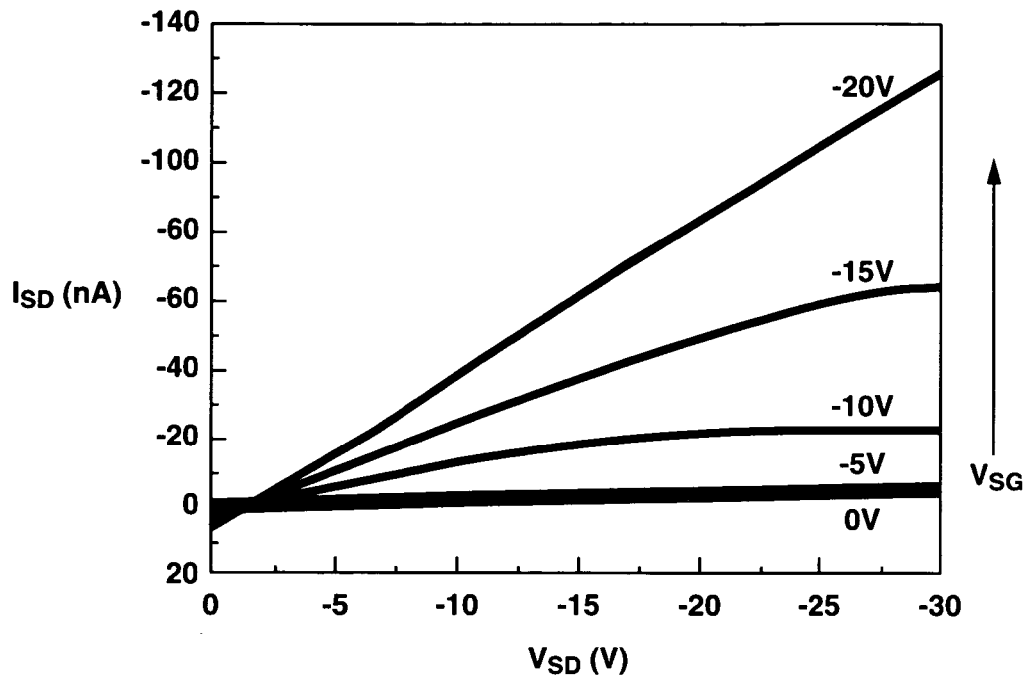
FIG. 3 shows $I_{SD}$-$V_{SD}$ curves at different gate voltages of a thin-layer chemical transistor in Example.

FIG. 3 shows source-drain current versus voltage $I_{SD}$-$V_{SD}$ curves at different gate voltages. At $V_{SG} > -1$ volt, the source-drain current $I_{SD}$ was kept unchanged. At $V_{SG} < -1$ volt, $I_{SD}$ increased as the gate voltage rose. At $V_{SG} < -1$ volt, poly(3-hexylthiophene) was doped with $BF_4^{-}$ whereby the semiconductor layer was of p type. Then the response of source-drain current flow relative to the gate voltage is the same as the field-effect transistor.

On the other hand, for $V_{SD} = -30$ volts, $I_{SD}$ at $V_{SG} = 0$ volt and $-20$ volts were $-4.7$ nA and $-0.13$ μA, respectively, providing an ON/OFF ratio of 28.

To evaluate the switching peformance of this transistor, the response of source-drain current $I_{SD}$ to the AC gate voltage was measured. With $V_{SD}$ fixed at $-10$ volts, measurement was made by applying a sine wave gate voltage in the range from $-6$ volts to 0 volt at a frequency of 1 Hz to 1 kHz, finding a change with time of $I_{SD}$ up to a frequency of about 300 Hz.

Figure 4:
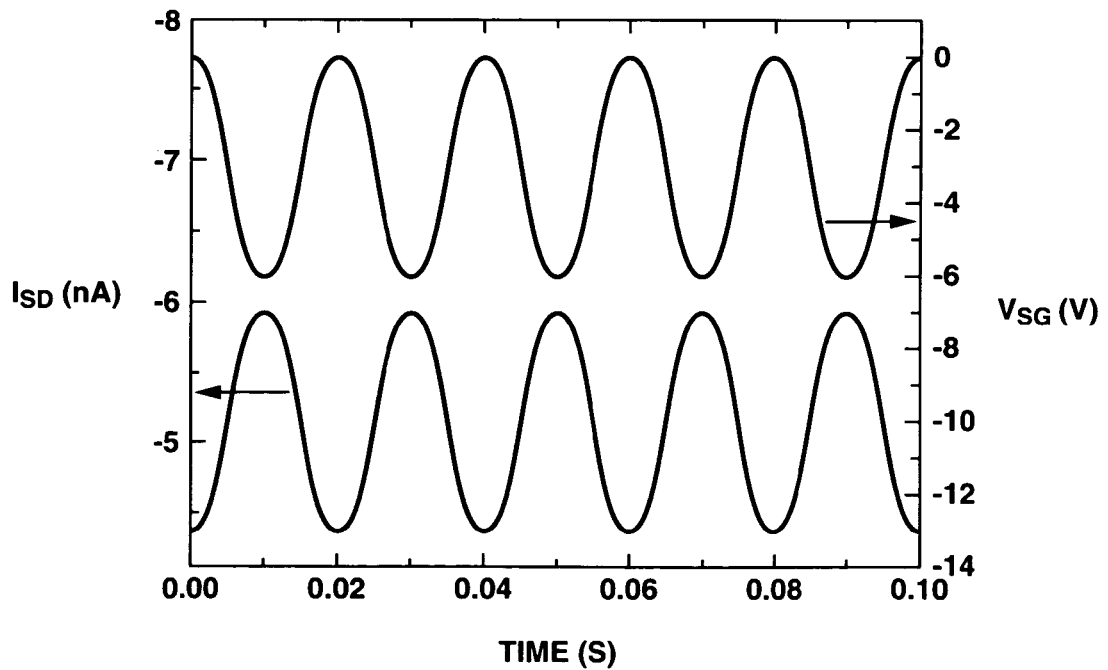
FIG. 4 shows $I_{SD}$ and $V_{SD}$ curves with time of the thin-layer chemical transistor in Example.

A change with time of $I_{SD}$ at a frequency of 50 Hz corresponding to a transistor's switching speed of 20 msec was observed. As shown in FIG. 4, in the region where $V_{SG}$ decreases from 0 volt to $-6$ volts, doping of poly(3-hexylthiophene) occurs so that the value of $I_{SD}$ increases. Inversely, in the region where $V_{SG}$ increases from $-6$ volts to 0 volt, dedoping occurs so that the value of $I_{SD}$ decreases. Maximum and minimum values of $I_{SD}$ were 5.9 nA and 4.3 nA, respectively, indicating an amplification of $I_{SD}$ of 38%.

Japanese Patent Application No. 2004-251779 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A thin-layer chemical transistor comprising:
   a substrate;
   a metal layer formed on the substrate and serving as a gate electrode;
   an inorganic ion salt-containing solid electrolyte layer formed on the metal layer;
   a semiconductor layer formed on the solid electrolyte layer;
   a source electrode; and
   a drain electrode,
   wherein the material of which the solid electrolyte layer is made consists of an organic solvent-soluble polymer compound and an inorganic ion salt, and the material of which the semiconductor layers is made comprises an organic solvent-soluble polymer compound.

2. The transistor of claim 1, wherein the solid electrolyte layer comprises an organic solvent-soluble polymer compound and an inorganic ion salt.

3. The transistor of claim 1, wherein the organic solvent-soluble polymer compound of which the solid electrolyte layer is made has an ionic conductivity of at least $1 \times 10^{-5}$ $Scm^{-1}$.

4. The transistor of claim 1, wherein the organic solvent-soluble polymer compound of which the solid electrolyte layer is made is a polymer having a weight average molecular weight of 2,000 to 1,000,000 as measured by GPC relative to polystyrene standards.

5. The transistor of claim 4, wherein the polymer is an insulating polymer having cyano groups.

6. The transistor of claim 4, wherein the polymer is an insulating polymer having cyanoethyl groups.

7. The transistor of claim 6, wherein the polymer is cyanoethylpullulan.

8. The transistor of claim 6, wherein the insulating polymer having cyanoethyl groups contains up to 100 ppm of bis-2-cyanoethyl ether.

9. The transistor of claim 1, wherein the organic solvent-soluble compound of which the semiconductor layer is made is electrochemically reversible.

10. The transistor of claim 1, wherein the organic solvent-soluble polymer compound of which the semiconductor layer is made is a polymer having a weight average molecular weight of 2,500 to 1,000,000 as measured by GPC relative to polystyrene standards.

11. The transistor of claim 10, wherein the organic solvent-soluble polymer compound of which the semiconductor layer is made is a polythiophene.

12. The transistor of claim 1, wherein the inorganic ion salt contains at least one element selected from the group consisting of Li, Na, K, Cs, Ag, Cu, Mg and Rb, and the anion is one selected from the group consisting of $Ce^{-}$, $I^{-}$, $Br^{-}$, $ClO_4^{-}$, $SCN^{-}$, $BF_4^{-}$, $AsF_5^{-}$, $CF_3SO_3^{-}$, $PF_4^{-}$, $PF_5^{-}$, $PF_6^{-}$ and $NO_3$.

13. The transistor of claim 12, wherein the inorganic ion salt is one selected from the group consisting of $LiClO_4$, LiI, LiSCN, $LiBF_4$, $LiAsF_5$, $LiCF_3SO_3$, $LiPF_4$, NaI, NaSCN, NaBr, $NaPF_5$, KI, KSCN, $KPF_5$, $KAsF_5$, CsSCN, $CsPF_6$, $AgNO_3$, $CuCl_2Mg(ClO_4)_2$, and $Rb_4I_{1.75}Cl_{3.25}$.

14. The transistor of claim 1, wherein the metal layer is an indium tin oxide (ITO) film, single metal layer selected from the group consisting of Au, Cu and Al, or a metal layer laminate selected from the group consisting of Au/Ti, Cu/Ti and Al/Ti.

* * * * *